United States Patent [19]
Sezi et al.

[11] Patent Number: 5,696,218
[45] Date of Patent: Dec. 9, 1997

[54] PREPARATION OF POLY-O-HYDROXYAMIDES AND POLY-O-MERCAPTOAMIDES

[75] Inventors: Recai Sezi; Hellmut Ahne, both of Roettenbach; Roland Gestigkeit, Nuremberg, all of Germany

[73] Assignee: Siemens Aktiengesellschaft, München, Germany

[21] Appl. No.: 705,469

[22] Filed: Aug. 29, 1996

[30] Foreign Application Priority Data

Aug. 31, 1995 [DE] Germany .................. 195 32 202.9

[51] Int. Cl.⁶ .................................. C08G 69/04
[52] U.S. Cl. .................. 528/210; 528/219; 528/374; 528/375
[58] Field of Search ............... 528/210, 219, 528/374, 375; 558/392, 415; 564/166, 183

[56] References Cited

U.S. PATENT DOCUMENTS

| | | | |
|---|---|---|---|
| 4,331,592 | 5/1982 | Wissman et al. | 260/112.5 |
| 4,339,521 | 7/1982 | Ahne et al. | 430/192 |
| 4,622,285 | 11/1986 | Ahne | 430/322 |
| 4,849,051 | 7/1989 | Ahne et al. | 156/659.1 |
| 5,021,320 | 6/1991 | Mueller et al. | 430/192 |
| 5,037,720 | 8/1991 | Khanna | 430/190 |
| 5,096,999 | 3/1992 | Hellmut et al. | 528/182 |
| 5,194,568 | 3/1993 | Gregory et al. | 528/184 |
| 5,219,981 | 6/1993 | Gregory et al. | 528/377 |
| 5,270,432 | 12/1993 | Hergenrother et al. | 528/128 |

FOREIGN PATENT DOCUMENTS

| | | |
|---|---|---|
| 0 023 662 | 5/1983 | European Pat. Off. . |
| 0 158 726 | 10/1985 | European Pat. Off. . |
| 0 264 678 | 4/1988 | European Pat. Off. . |
| 0 391 196 | 10/1990 | European Pat. Off. . |
| 0 481 402 | 4/1992 | European Pat. Off. . |
| 0 291 779 | 7/1994 | European Pat. Off. . |
| 3 716 629 | 12/1988 | Germany . |
| WO 91/09081 | 6/1991 | WIPO . |

OTHER PUBLICATIONS

Labadie, J. et al., "Recent Advances in High Temperature Polymers For Microelectronic Applications," *SAMPE Journal*, vol. 25, No. 6, 1989, pp. 18–23.

Soane, D. et al., "Resists in Microlithography," *Polymers in Microelectronics Fundamentals and Applications*, Amsterdam–Oxford–New York–Tokyo (1989), pp. 77–124.

Rutter, E.W. et al., "A Photodefinable Benzocyclobutene Resin For Thin Film Microelectronic Applications," *Proceedings of the 1992 International Conference on Multichip Modules*, Apr. 1–3, 1992 Radisson Hotel Denver, pp. 394–400.

Mercer, F., "Aromatic Poly(ether imide oxadiazole)s," *High Performance Polymers*, vol. 4, No. 2 (1992), pp. 73–80.

Ahne, H. et al., "Recent Advances in Photosensitive Polyimides," *Polymers for Advanced Technologies*, vol. 4 (1993), pp. 217–233.

*Primary Examiner*—Joseph McKane
*Attorney, Agent, or Firm*—Kenyon & Kenyon

[57] ABSTRACT

In a process for the preparation of poly-o-hydroxyamides and poly-o-mercaptoamides, a bis-o-hydroxyamide or a bis-o-mercaptoamide is reacted with a dihydroxy compound in the presence of a basic catalyst.

11 Claims, No Drawings

PREPARATION OF POLY-O-HYDROXYAMIDES AND POLY-O-MERCAPTOAMIDES

BACKGROUND OF THE INVENTION

1. Field of the Invention

The invention relates to a process for the preparation of poly-o-hydroxyamides (polybenzoxazole precursors) and poly-o-mercaptoamides (polybenzothiazole precursors).

2. Description of Related Art

Highly thermoresistant polymers are required in microelectronics, particularly as protective and insulating coatings and as dielectrics (see, for example, "SAMPE Journal" 25, No. 6, pp. 18–23 (1989) and "Proceedings of the 1992 International Conference on Multichip Modules", pp. 394–400). Some of the polymers used, such as homo- and copolymers of aromatic polyethers and precursors of polyimides (PI) and polybenzoxazoles (PBO) show a good solubility in organic solvents and good film-forming properties and can be applied to electronic components by means of spin-coating technology (see, for example, "High Performance Polymers" 4, No. 2, pp. 73–80 (1992) and "Polymers for Advanced Technologies" 4, pp. 217–233 (1993).

By means of a temperature treatment, polymer precursors of the above-mentioned type are cyclized, i.e., converted to the corresponding polymers (PI or PBO); this results in the final properties. This is because, as a result of the cyclization, the hydrophilic groups of the poly-o-hydroxyamide disappear, i.e., the NH, OH, and CO groups, which would have a negative effect on the dielectric properties and the water absorption. This is, for example, a significant advantage of the polybenzoxazoles as compared with the polyimides (with two CO groups per imide unit) and, in particular, as compared with the hydroxypolyimides (with two CO groups and one OH group per imide unit). In addition, the cyclization is important not only for the good dielectric properties and the low water absorption of the end product but also for its high temperature stability.

PI and PBO precursors can, for example, be adjusted photosensitively by the addition of suitable photoactive components and can then be structured directly, i.e., without the use of an auxiliary resist. This is important for the reason that direct structuring—as compared with indirect structuring—offers considerable cost advantages.

In contrast to most photosensitive PI precursors, photosensitive PBO precursors offer the advantages of a positive structurability, such as a lower defect density in the structuring of the so-called "via holes", because—in comparison with negative operating systems—only a fraction of the surface is exposed to light. The use of alkali-soluble PBO precursors also results in the possibility of an aqueous alkaline development. After the photostructuring, the cyclization of the precursors is then carried out by annealing.

PBO precursors that can be developed in aqueous alkaline medium are already known (see European Patent 0 023 662, European Application 0 264 678, and European Patent 0 291 779). The photolithographic process used, except for the cyclization, is the same as in the structuring of known positive resists based on novolaks and quinone azides, a process that is used in numerous production lines worldwide (see, for example, D. S. Soane and Z. Martynenko: "Polymers in Microelectronics—Fundamentals and Applications", Elsevier, Amsterdam (1989), pp. 77–124).

The solubility of the PBO precursors in alkalies is an important requirement for their use as base polymers for photosensitive dielectrics that can be developed in aqueous alkalies. For microelectronic uses, the precursors must be soluble in developers free of metal ions, so that developers of this type can also be used in the photostructuring. This is because developers containing metal ions can have a negative effect on the electrical operation of the components.

The most common method for the preparation of alkali-soluble PBO precursors, i.e., of poly-o-hydroxyamides, is the reaction of a dicarboxylic acid chloride with a suitable bis-o-aminophenol. To capture the hydrogen chloride formed in the reaction, a soluble base, such as pyridine, is added, as a rule (see European Application 0 264 678 and European Patent 0 291 779). Although it is possible, by means of this method, to prepare precursors that are soluble in aqueous alkaline developers free of metal ions, there is the disadvantage that chloride ions remain in the polymer. However, a polymer of this type can not be used as a coating material for microelectronic components, because the chloride ions cause corrosion and can thus strongly impair the operation of the components. A purification of the polymer by means of ion exchangers is therefore required. However, this purification is time-consuming and expensive, as it includes additional process stages, such as the preparation of the ion-exchange column, dissolution of the polymer, passage of the solution through the column and rewashing, and repetition of the precipitation and drying.

In the preparation of poly-o-hydroxyamides, it is also necessary to meet the requirement that the dicarboxylic acid chloride react predominantly with the amino groups of the bis-o-aminophenol (with amide formation), but not with its hydroxyl groups (with ester formation), i.e., the reaction selectivity of the amide formation must be high as compared with that of the ester formation. If the ester formation can not be excluded or strongly suppressed, then this will lead to insufficiently alkali-soluble polymers. A low reaction selectivity can also lead to a gel formation in the polymer solution, as a result of which the poly-o-hydroxyamide produced then becomes unfilterable and thus useless.

Processes for the chloride-free synthesis of poly-o-hydroxyamides—and also of poly-o-mercaptoamides—have also already been described. Thus, it is known, from European Application 0 158 726, to react dihydroxy- and dimercaptodiamino compounds with a dicarboxylic acid in the presence of a carbodiimide. However, in this reaction, urea residues remaining on the resin as a result of a rearrangement reaction frequently present problems. This is because they reduce the thermal stability of the polybenzoxazole or polybenzothiazole and the quality of the coatings prepared from these. In addition, the polymers produced by this process are not sufficiently soluble in aqueous alkaline developers free of metal ions.

An alternative chloride-free production process for poly-o-hydroxyamides consists of using condensation reagents, such as 1-ethoxycarbonyl-2-ethoxy-1,2-dihydroquinoline and 1,1'-carbonyldioxydi-1,2,3-benzotriazole (see European Application 0 391 196) for the reaction of the dicarboxylic acid with the bis-o-aminophenol. However, the polymers produced in this manner also show an insufficient solubility in aqueous alkaline developers free of metal ions.

Processes are also known in which the amide formation takes place by means of phosphorus compounds (see: European Application 0 481 402, U.S. Pat. No. 4,331,592, and German Application 3,716,629). However, in the case of poly-o-hydroxyamides, syntheses of this type lead either to cyclized, i.e. alkali-insoluble, products, or phosphorus-containing, in part also chemically bonded, residues remain in the polymer, as a result of which the polymer, because of the doping properties of phosphorus, becomes unusable for microelectronic applications. This is because, in contrast to ionic impurities, residues of this type can not be removed, e.g., by means of ion exchangers.

It is the object of the invention to indicate an economical process by means of which—in a chloride-free manner—poly-o-hydroxyamides and poly-o-mercaptoamides that are soluble in aqueous alkaline developers free of metal ions can be prepared.

According to the invention, this is achieved by reacting a bis-o-hydroxyamide or a bis-o-mercaptoamide with the structure:

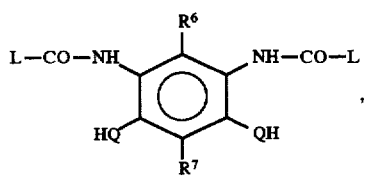

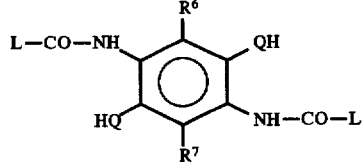

or

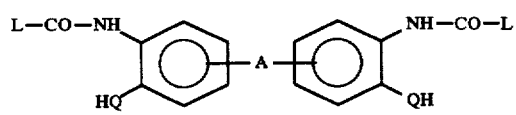

in the presence of a basic catalyst with a dihydroxy compound with the structure

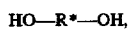

where the following applies:

Q=O or S;

$R^6$ and $R^7$=H, F, CH$_3$, CF$_3$, CN, or NO$_2$ (independently of each other);

A=(CH$_2$)$_n$, (CF$_2$)$_p$, C(CH$_3$)$_2$, C(CF$_3$)$_2$, C(CH$_3$) (C$_6$H$_5$), C(CF$_3$) (C$_6$H$_5$), C(CF$_3$) (C$_6$F$_5$), C(C$_6$H$_5$)$_2$, CF$_2$—CF (CF$_3$), CH=CH, CF=CF, C≡C, O—C$_6$H$_4$—O, O, S, CO, or SO$_2$, where n=0 to 10 and p=1 to 10;

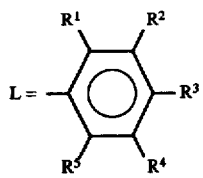

where $R^1$, $R^2$, $R^3$, $R^4$, $R^5$ are, independently of each other, H, F, CN, or NO$_2$, and where at least one of the groups $R^1$ through $R^5$ is F, CN, or NO$_2$ and no more than two of the groups $R^1$ through $R^5$ are CN or NO$_2$;

R* has the following meaning:

(CR$_2$)$_m$, where R=H, F, CH$_3$, or CF$_3$ and m=1 to 10;

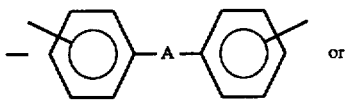

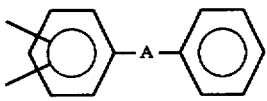

where

A=(CH$_2$)$_n$, (CF$_2$)$_p$, C(CH$_3$)$_2$, C(CF$_3$)$_2$, C(CH$_3$) (C$_6$H$_5$), C(CF$_3$) (C$_6$H$_5$), C(CF$_3$) (C$_6$F$_5$), C(C$_6$H$_5$)$_2$, CF$_2$—CF (CF$_3$), CH=CH, CF=CF, C≡C, O—C$_6$H$_4$—O, O, S, CO, or SO$_2$, where n=0 to 10 and p=1 to 10;

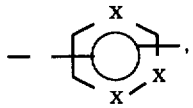

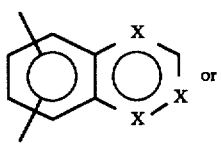

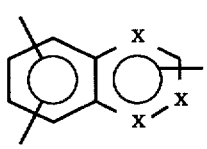

where

X=CH or N;

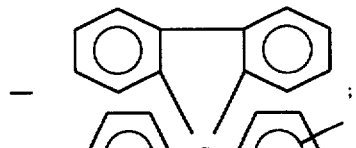

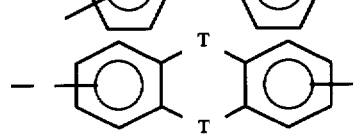

or

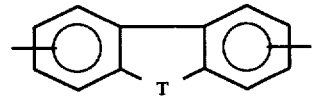

where

T=CH$_2$, CF$_2$, CO, O, S, NH, or N(CH$_3$);

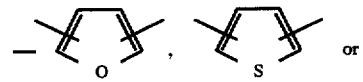

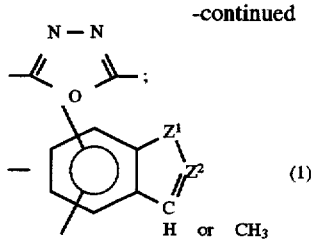

(1)

where
(a) $Z^1$=CH$_2$ or CH(CH$_3$) and $Z^2$=CH or C(CH$_3$)
(b) $Z^1$=CH$_2$ or CH(CH$_3$) and $Z^2$=N
(c) $Z^1$=NH or N(CH$_3$) and $Z^2$=CH or C(CH$_3$)
(d) $Z^1$=NH or N(CH$_3$) and $Z^2$=N

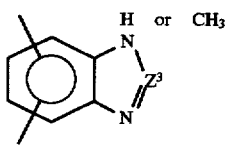

(2)

where
(a) $Z^3$=CH or C(CH$_3$)
(b) $Z^3$=N

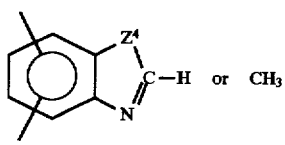

(3)

where
(a) $Z^4$=O
(b) $Z^4$=S;

where, in each case, all hydrogen atoms (H) in all aromatic partial structures can be replaced by fluorine (F).

SUMMARY OF THE INVENTION

The invention solves the problem described above by reacting a dihydroxy compound with a bis-o-hydroxyamide (dihydroxydiamide) or a bis-o-mercaptoamide (dimercaptodiamide); the preparation of polybenzoxazole and polybenzothiazole precursors by a process of this type is not known so far. In this process, surprisingly, a selective reaction between the monomers used is obtained. This is because the polymers prepared according to the invention, i.e., the poly-o-hydroxy- and the poly-o-mercaptoamides, are soluble in aqueous alkaline developers free of metal ions. In addition, the process according to the invention takes place without gel formation, so that the above-mentioned polymers are readily soluble and processable in organic solvents. Also, impurities such as chloride and metal ions and phosphorus compounds are avoided in this process.

It is true that it is known to prepare aromatic polyethers from perfluorinated aromatic compounds and dihydroxy compounds by means of a basic catalyst (WO 91/09081). However, the preparation of hydroxyl-group-containing, alkali-soluble polymers in general and of polybenzoxazole and polybenzothiazole precursors in particular by a process of this type has not been described so far. There are also no indications concerning a selective reaction for the preparation of these alkali-soluble precursors from dihydroxydiamides and dihydroxy compounds.

The process according to the invention not only shows the advantage of a selective reaction, but also offers many possibilities for alteration of the polymer structure and thus for adaptation of the desired properties. This is because, in this process, the number of available combinations of the starting monomers is significantly larger than is the case in known processes.

The diamides used in the process according to the invention can, in each case, be prepared from a bis-o-aminophenol or -thiophenol and a monocarboxylic acid or an acid derivative. Because the number of available monocarboxylic acids is much larger than that of dicarboxylic acids, a larger selection possibility thus exists in the reaction of diamides with dihydroxy compounds.

The monocarboxylic acids have the structure L—COOH, where L represents a substituted phenyl group. The substituents in this case can be F, CN, or NO$_2$, with F being preferred. The monocarboxylic acid is thus advantageously a perfluorobenzoic acid, i.e., pentafluorobenzoic acid.

Particularly suitable bis-o-aminophenols are 2,2-bis(3-amino-4-hydroxyphenyl)hexafluoropropane and 3,3'-dihydroxy-4,4'-diaminodiphenyl. For the synthesis of poly-o-mercaptoamides, the corresponding bis-o-aminothiophenols are used. In principle, however, all bis-o-aminophenols and -thiophenols that are customarily used for the preparation of polybenzoxazole and polybenzothiazole precursors can be used.

The diamides prepared by the reaction of bis-o-amino(thio)phenols with monocarboxylic acids can be purified in a simple manner, for example, by recrystallization or extraction. Ionic or organic impurities can be easily removed in this manner, if necessary.

The dihydroxy- and dimercaptodiamides are reacted with a dihydroxy compound. The dihydroxy compound can be varied within broad limits, with bisphenols being preferred.

The reaction of the diamide with the dihydroxy compound takes place in the presence of a basic catalyst. This catalyst is advantageously an inorganic carbonate, such as sodium and potassium carbonate (Na$_2$CO$_3$ and K$_2$CO$_3$, respectively), but can also be a tertiary amine. Catalysts of this type are, in particular, pyridine, triethylamine, diazabicyclooctane, and polyvinylpyridine. However, other basic catalysts can also be used, in which case preference is given to those that are readily soluble in the solvent used in the synthesis of the precursor, such as N-methylpyrrolidone, or are readily soluble in water or water/alcohol mixtures (precipitants).

The reaction temperature in the reaction between the diamide and the dihydroxy compound is preferably between about 60° C. and about 150° C.

In the base-catalyzed reaction of the diamide with the dihydroxy compound, a reaction takes place between the hydroxyl groups of the dihydroxy compound and fluoro, cyano, or nitro groups of the substituted phenyl groups of the diamide originating from the monocarboxylic acid, which phenyl groups are bonded to the amide groups. Groups of the type —NH—CO—L*—O—R*—O—L*—CO—NH— are then formed in this process, where L* represents the group L minus the leaving substituent (F, CN, or NO$_2$). In each case, an OH— or SH— group is adjacent to these groups in the ortho position, so that, during an annealing, polymers with benzoxazole or benzothiazole structures are obtained.

Dimethylformamide, N,N-dimethylacetamide, dimethyl sulfoxide, and N-Methylpyrrolidone are suitable solvents. In principle, however, one can use any solvent in which the starting components are readily soluble. Particularly suitable precipitants are water and mixtures of water with alcohols, such as ethanol and isopropanol.

DETAILED DESCRIPTION

The invention will be explained in greater detail by means of exemplifying embodiments.

EXAMPLE 1

Preparation of a PBO Precursor

The following are placed in a 100-ml three-necked flask under nitrogen (as a protective gas): 1.95 g of 4,4'-(hexafluoroisopropylidene)diphenol (5.8 mmol), i.e., bisphenol AF, 0.76 g of potassium carbonate (5.5 mmol), and 30 ml of dry dimethylformamide, and the mixture is then stirred for one hour at 120° C. The mixture is permitted to cool to 80° C. and 4.0 g of a dihydroxydiamide (5.3 mmol), prepared from 2,2-bis(3-amino-4-hydroxyphenyl)hexafluoropropane and pentafluorobenzoic acid and dissolved in 20 ml of dimethylformamide, is then added dropwise. The solution is then stirred for 20 hrs at 80° C. After cooling to room temperature, the light brown reaction solution is filtered and is placed in 500 ml of a mixture of three parts by volume of water and one part by volume of isopropanol (as precipitant). The precipitated white polymer is filtered off and washed twice with 200-ml portions of precipitant. The polymer is then dried, first at 10 mbar and then at $10^{-2}$ mbar, in each case at 50° C. The yield is 4.44 g.

EXAMPLE 2

Solubility of the PBO Precursor and Film Formation 1 g of the PBO precursor prepared according to Example 1 is dissolved in 4 g of N-methylpyrrolidone and the solution is placed in a plastic syringe equipped with a preliminary filter. The polymer solution is then applied by means of the syringe to a purified and dried silicon wafer and this is centrifuged in a centrifuge apparatus (Convac, type ST 146). Drying is then carried out on a hot plate at 115° C., during which a uniform film is formed on the wafer. After cooling, the wafer coated with the polymer film is immersed in a commercially available aqueous alkaline developer free of metal ions (NMD-W, 2.38%, Tokyo Ohka). During this process, the polymer film dissolves uniformly, i.e. without cracking and without flaking off. After only a short time, the whole polymer film is completely dissolved in the developer. The same result is obtained if, instead of the above-mentioned developer, a 3% solution of tetramethylammonium hydroxide in distilled water is used.

A corresponding solution of the PBO precursor is centrifuged on to a silicon wafer, dried at 115° C., and then annealed in an annealing furnace (HS 337, Seiter) at 350° C. under nitrogen. A uniform, highly temperature-resistant polybenzoxazole film is formed in this process.

EXAMPLE 3

Preparation of a PBO Precursor

The following are placed in a 100-ml three-necked flask under nitrogen (as a protective gas): 1.2 g of bis(4-hydroxyphenyl)propane (5.4 mmol), i.e., bisphenol A, 4.0 g of a dihydroxydiamide (5.4 mmol according to Example 1, 0.72 g of triethylamine (7.0 mmol), and 50 ml of dry dimethylformamide, and the mixture is then heated to 80° C. and stirred for 20 hrs at that temperature. After cooling to room temperature, the light brown reaction solution is filtered and is placed in 400 ml of a mixture of three parts by volume of water and one part by volume of isopropanol (as precipitant). The precipitated white polymer is filtered off and washed twice with 200-ml portions of water. The polymer is then dried, first at 10 mbar and then at $10^{-2}$ mbar, in each case at 50° C. The yield is 3.3 g.

EXAMPLE 4

Solubility of the PBO Precursor and Film Formation

If the procedure of Example 2 is used with the PBO precursor prepared according to Example 3, then the same results are obtained, i.e., the PBO precursor dissolves uniformly in both aqueous alkaline developers free of metal ions and shows a good film formation.

What is claimed is:

1. A process for the preparation of poly-o-hydroxyamides and poly-o-mercaptoamides, comprising the step of reacting in the presence of a basic catalyst, a bis-o-hydroxyamide or a bis-o-mercaptoamide having the structure

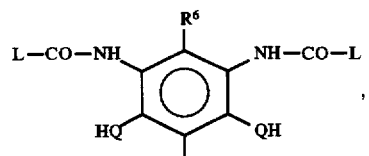

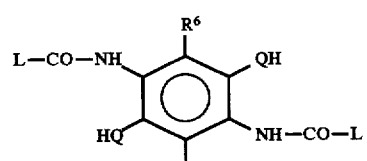

or

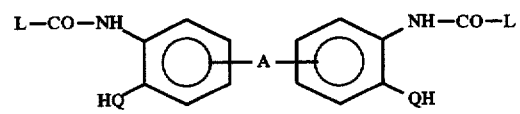

with a dihydroxy compound having the structure

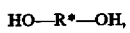

where the following applies:

Q=O or S;

$R^6$ and $R^7$=H, F, $CH_3$, $CF_3$, CN, or $NO_2$ (independently of each other);

A=$(CH_2)_n$, $(CF_2)_p$, $C(CH_3)_2$, $C(CF_3)_2$, $C(CH_3)(C_6H_5)$, $C(CF_3)(C_6H_5)$, $C(CF_3)(C_6F_5)$, $C(C_6H_5)_2$, $CF_2$—CF($CF_3$), CH=CH, CF=CF, C≡C, O—$C_6H_4$—O, O, S, CO, or $SO_2$, where n=0 to 10 and p=1 to 10;

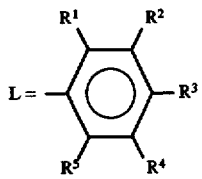

where $R^1$, $R^2$, $R^3$, $R^4$, and $R^5$ are, independently of each other, H, F, CN, or $NO_2$, where at least one of the groups $R^1$ through $R^5$ is F, CN, or $NO_2$ and no more than two of the groups $R^1$ through $R^5$ are CN or $NO_2$;

R* has the following meaning:

$(CR_2)_m$, with R=H, F, $CH_3$, or $CF_3$ and $m$=1 to 10;

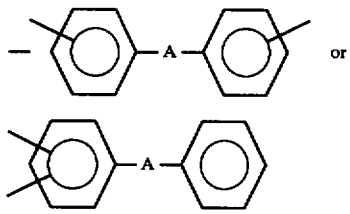

where

A=$(CH_2)_n$, $(CF_2)_p$, $C(CH_3)_2$, $C(CF_3)_2$, $C(CH_3)$ $(C_6H_5)$, $C(CF_3)$ $(C_6H_5)$, $C(CF_3)$ $(C_6F_5)$, $C(C_6H_5)_2$, $CF_2$—CF $(CF_3)$, CH=CH, CF=CF, C≡C, O—$C_6H_4$—O, O, S, CO, or $SO_2$, where n=0 to 10 and p=1 to 10;

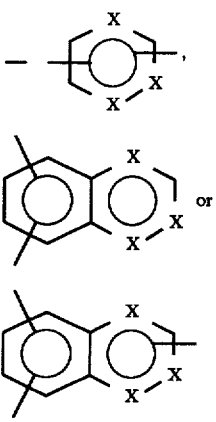

where

X=CH or N;

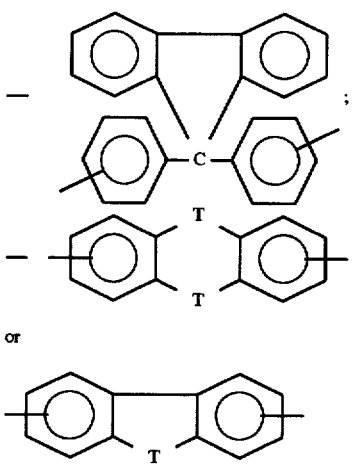

where

T=$CH_2$, $CF_2$, CO, O, S, NH, or $N(CH_3)$;

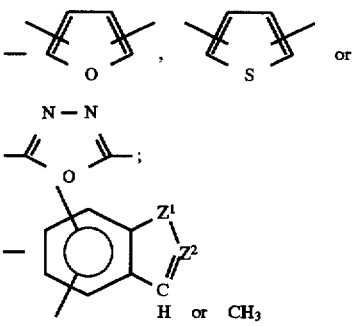

where
$Z^1$=$CH_2$ or $CH(CH_3)$ and $Z^2$=CH or $C(CH_3)$
$Z^1$=$CH_2$ or $CH(CH_3)$ and $Z^2$=N
$Z^1$=NH or $N(CH_3)$ and $Z^2$=CH or $C(CH_3)$
$Z^1$=NH or $N(CH_3)$ and $Z^2$=N

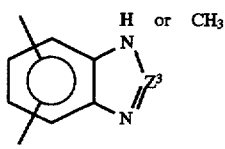

where
$Z^3$=CH, $C(CH_3)$, or N

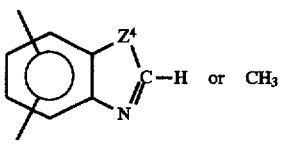

where
$Z^4$=O or S;

where, in each case, all hydrogen atoms in all aromatic partial structures can be replaced by fluorine.

2. A process according to claim 1, wherein the bis-o-hydroxyamide is prepared from 2,2-bis(3-amino-4-hydroxyphenyl)hexafluoropropane and pentafluorobenzoic acid.

3. The process according to claim 1, wherein the dihydroxy compound is a bisphenol.

4. The process according to claim 2, wherein the dihydroxy compound is a bisphenol.

5. The process according to claim 1, wherein the catalyst is sodium carbonate or potassium carbonate.

6. The process according to claim 4, wherein the catalyst is sodium carbonate or potassium carbonate.

7. The process according to claim 1, wherein the catalyst is a tertiary amine.

8. The process according to claim 4, wherein the catalyst is a tertiary amine.

9. The process according to claim 1, wherein the reaction is carried out at temperatures of from about 60° C. to about 150° C.

10. The process according to claim 6, wherein the reaction is carried out at temperatures of from about 60° C. to about 150° C.

11. The process according to claim 8, wherein the reaction is carried out at temperatures of from about 60° C. to about 150° C.

* * * * *